(12) United States Patent
Kawai

(10) Patent No.: US 11,968,785 B2
(45) Date of Patent: Apr. 23, 2024

(54) MOUNTING DEVICE AND CONTROL METHOD FOR SAME

(71) Applicant: FUJI CORPORATION, Aichi (JP)

(72) Inventor: Hidetoshi Kawai, Anjo (JP)

(73) Assignee: FUJI CORPORATION, Chiryu (JP)

(*) Notice: Subject to any disclaimer, the term of this patent is extended or adjusted under 35 U.S.C. 154(b) by 904 days.

(21) Appl. No.: 16/977,588

(22) PCT Filed: Mar. 15, 2018

(86) PCT No.: PCT/JP2018/010180
§ 371 (c)(1),
(2) Date: Sep. 2, 2020

(87) PCT Pub. No.: WO2019/176041
PCT Pub. Date: Sep. 19, 2019

(65) Prior Publication Data
US 2020/0413579 A1 Dec. 31, 2020

(51) Int. Cl.
*H05K 13/04* (2006.01)
(52) U.S. Cl.
CPC ....... *H05K 13/041* (2018.08); *H05K 13/0409* (2018.08); *H05K 13/0413* (2013.01); *H05K 13/0419* (2018.08); *H05K 2203/0147* (2013.01)
(58) Field of Classification Search
CPC ................ B25J 11/0095; H01L 21/677; H01L 21/6838; H05K 13/041; H05K 13/0409;
(Continued)

(56) References Cited

U.S. PATENT DOCUMENTS

| 6,085,893 A | 7/2000 | Asai et al. |
| 2002/0133940 A1 | 9/2002 | Kadomatsu et al. |
| 2013/0255057 A1 | 10/2013 | Komatsu et al. |

FOREIGN PATENT DOCUMENTS

| CN | 103369947 A | 10/2013 |
| JP | 5-3399 A | 1/1993 |

(Continued)

OTHER PUBLICATIONS

International Search Report dated May 29, 2018 in PCT/JP2018/010180 filed on Mar. 15, 2018, 2 pages.

*Primary Examiner* — Tyrone V Hall, Jr.
(74) *Attorney, Agent, or Firm* — Oblon, McClelland, Maier & Neustadt, L.L.P.

(57) ABSTRACT

A mounting device includes a mounting head, having a rotating body, which turns multiple pickup members by rotating the rotating body, in which the rotating body holds multiple pickup members, each of which being configured to pick up a component, the multiple pickup members being disposed at predetermined intervals along a predetermined circumference of the rotating body, and executes a forward rotation pickup processing of causing the pickup members to pick up the components from a supply section for supplying the components, and rotates the rotating body forwards, and when at least one of the pickup members is vacant resulting from an error of not holding the component, executes a backward rotation pickup processing which includes a processing of causing the rotating body to rotate backwards and a processing of causing the vacant pickup member to pick up the component from the supply section.

7 Claims, 8 Drawing Sheets

(58) Field of Classification Search
CPC .......... H05K 13/0419; H05K 13/0413; H05K 2203/0147
See application file for complete search history.

(56) References Cited

FOREIGN PATENT DOCUMENTS

| | | | |
|---|---|---|---|
| JP | 05003399 A | * | 1/1993 |
| JP | 8-167788 A | | 6/1996 |
| JP | 10-163692 A | | 6/1998 |
| JP | 2002-359494 A | | 12/2002 |

* cited by examiner

MOUNTING DEVICE AND CONTROL METHOD FOR SAME

TECHNICAL FIELD

The present description discloses a mounting device and a control method therefor.

BACKGROUND ART

As a conventional mounting device, there is proposed, for example, a mounting device including an intermittent rotating body on a circumference of which multiple component holding tools (suction nozzles) are mounted and in which the component holding tools can rotate on their axes while being allowed to move perpendicularly along their axial directions (for example, refer to Patent Literature 1). With this device, the structure of the intermittent rotating body can be made smaller in size, whereby the conveyance efficiency can be enhanced. In addition, components can be picked up while rotating the intermittent rotating body forwards and backwards, whereby the components can be picked up efficiently.

PATENT LITERATURE

Patent Literature 1: JP-A-H10-163692

BRIEF SUMMARY

Technical Problem

With a mounting device, for example, there may happen from time to time a case in which a pickup error occurs in picking up a component; however, a means for dealing with such an error is not particularly considered in the mounting device of Patent Literature 1. In the event that such a pickup error occurs, there has often happened, for example, a case in which a component is moved to be disposed under a vacant state in which no component is picked up. There has been a demand for an enhancement in efficiency in picking up and moving a component even with such an error.

The present disclosure has been made in view of the problem described above, and a main object thereof is to provide a mounting device capable of enhancing the efficiency in picking up and moving a component and a control method therefor.

Solution to Problem

A mounting device and a control method therefor which the present description discloses adopt the following means in order to achieve the main object described above.

A mounting device disclosed in the present description includes a mounting head, having a rotating body, which turns multiple pickup members by rotating the rotating body, in which the rotating body holds multiple pickup members, each of which being configured to pick up a component, the multiple pickup members being disposed at predetermined intervals along a predetermined circumference of the rotating body; a moving section configured to move the mounting head; and a control section executing a forward rotation pickup processing of causing the pickup members to pick up the components from a supply section for supplying the components, and rotates the rotating body forwards, and when at least one of the pickup members is vacant resulting from an error of not holding the component, the control section executing a backward rotation pickup processing which includes a processing of causing the rotating body to rotate backwards and a processing of causing the vacant pickup member to pick up the component from the supply section.

This mounting device executes the forward rotation pickup processing of causing the pickup members to pick up the components from the component supply section configured to the components and rotating the rotating body forwards, while in the event that there exists the pickup member which is vacant resulting from the error of not holding the component, executing the backward rotation pickup processing including the processing of rotating the rotating body backwards and the processing of causing the vacant pickup member to pick up the component from the supply section. With this mounting device, since the pickup member which is vacant resulting from the error is caused to pick up the component again, the existence of the vacant pickup member holding no component can be reduced. Additionally, with this mounting device, since the rotating body is rotated backwards in causing the vacant pickup member to pick up the component, the vacant pickup member can be caused to pick up the component quicker than when the vacant pickup member is caused to rotate forwards to pick up the component. Therefore, with this mounting device, the efficiency can be enhanced in picking up and moving the component.

DESCRIPTION OF EMBODIMENTS

Figure 1:
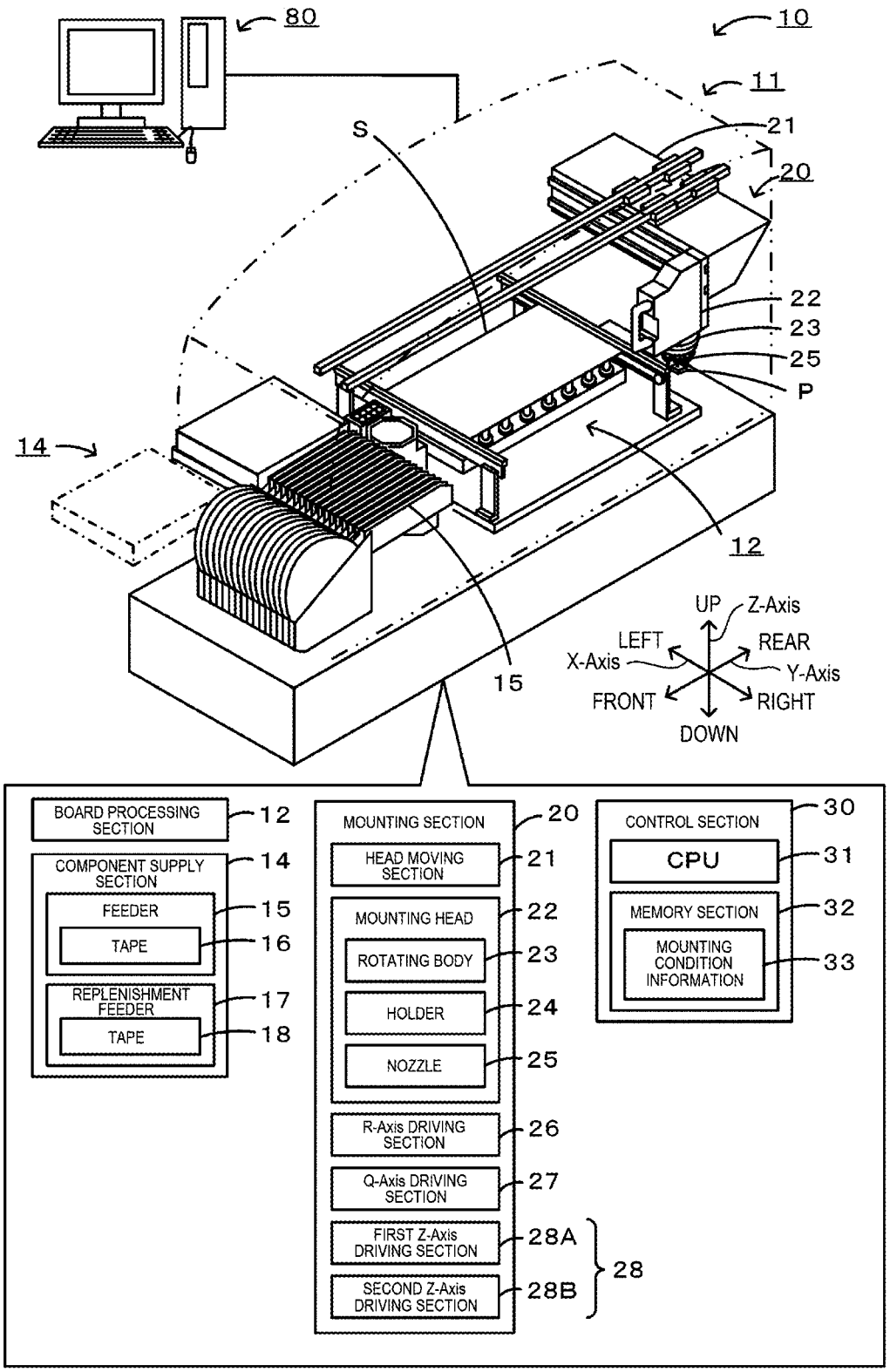
FIG. 1 is a brief explanatory view illustrating an example of mounting system 10.
Figure 2:
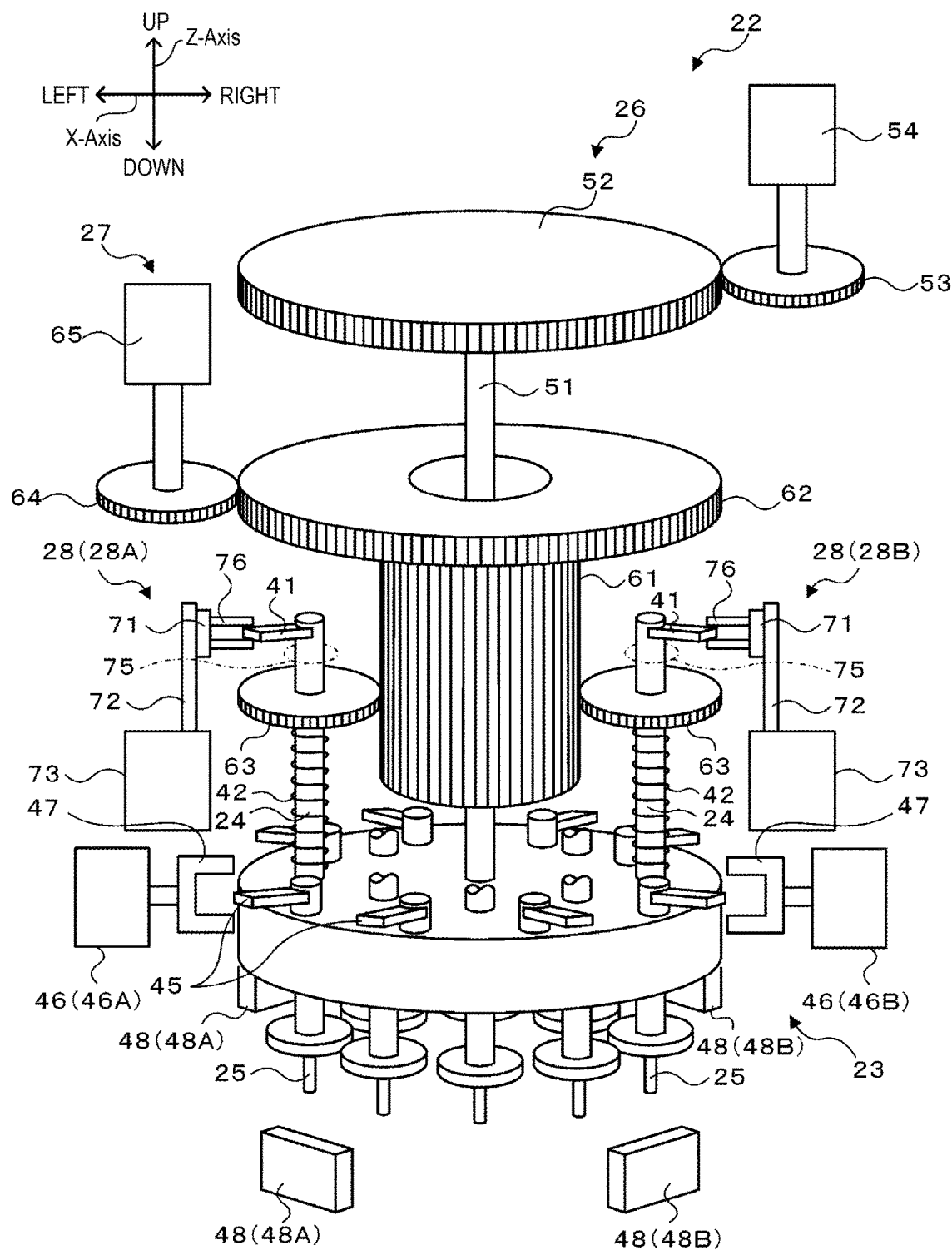
FIG. 2 is an explanatory view of mounting head 22.
Figure 3:
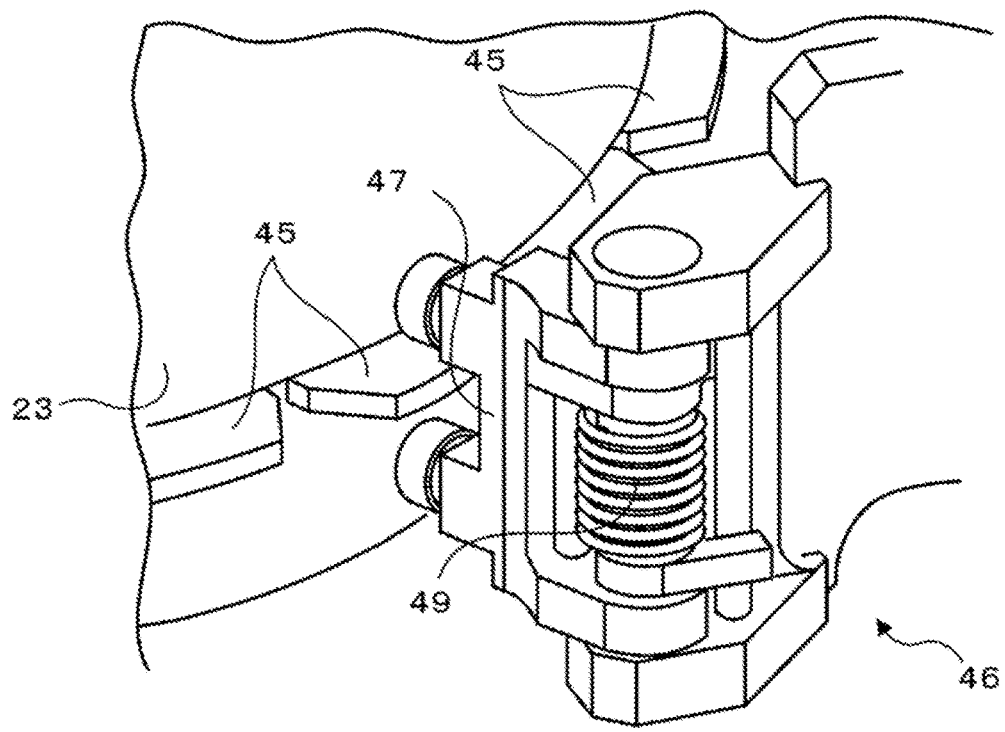
FIG. 3 is a perspective view of a lever gripping section 47 which grips valve operation lever 45.
Figure 4:
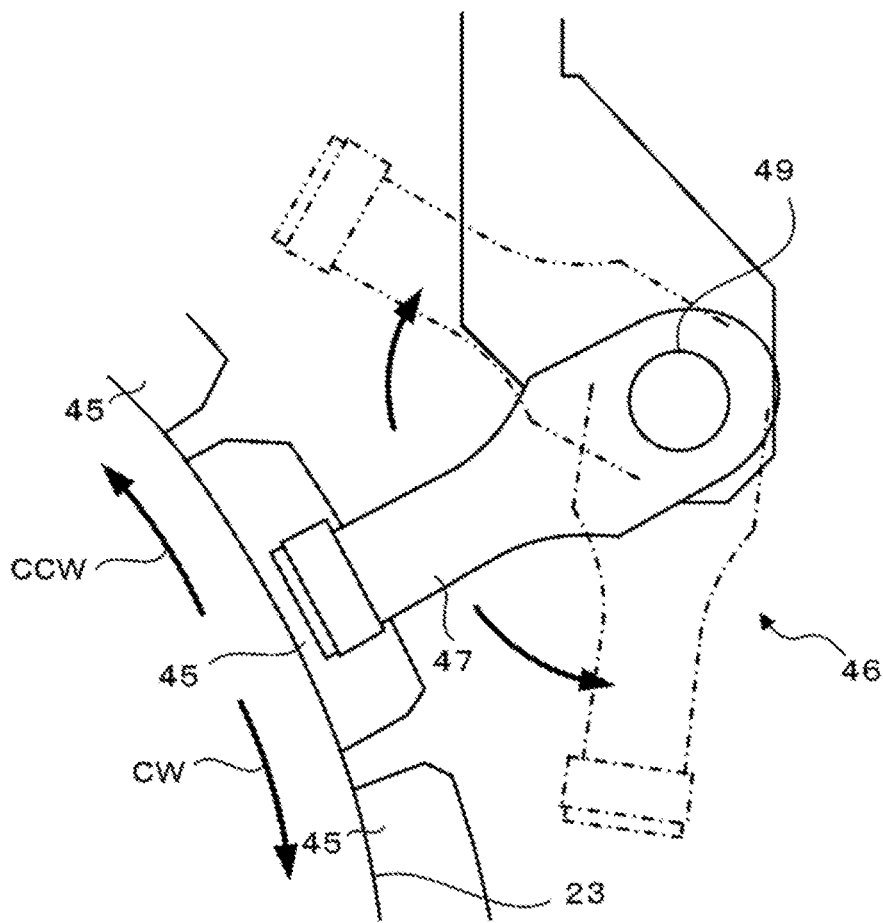
FIG. 4 is a plan view of lever gripping section 47 which grips valve operation lever 45.
Figure 5:
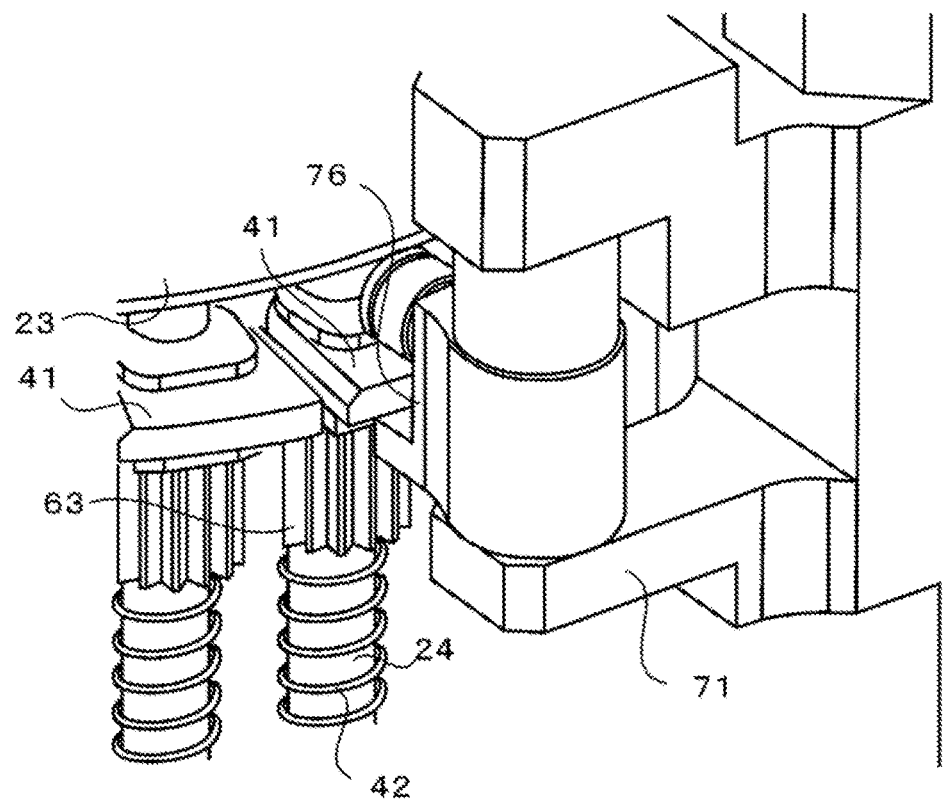
FIG. 5 is a perspective view of engagement piece gripping section 76 which grips engagement piece 41.
Figure 6:
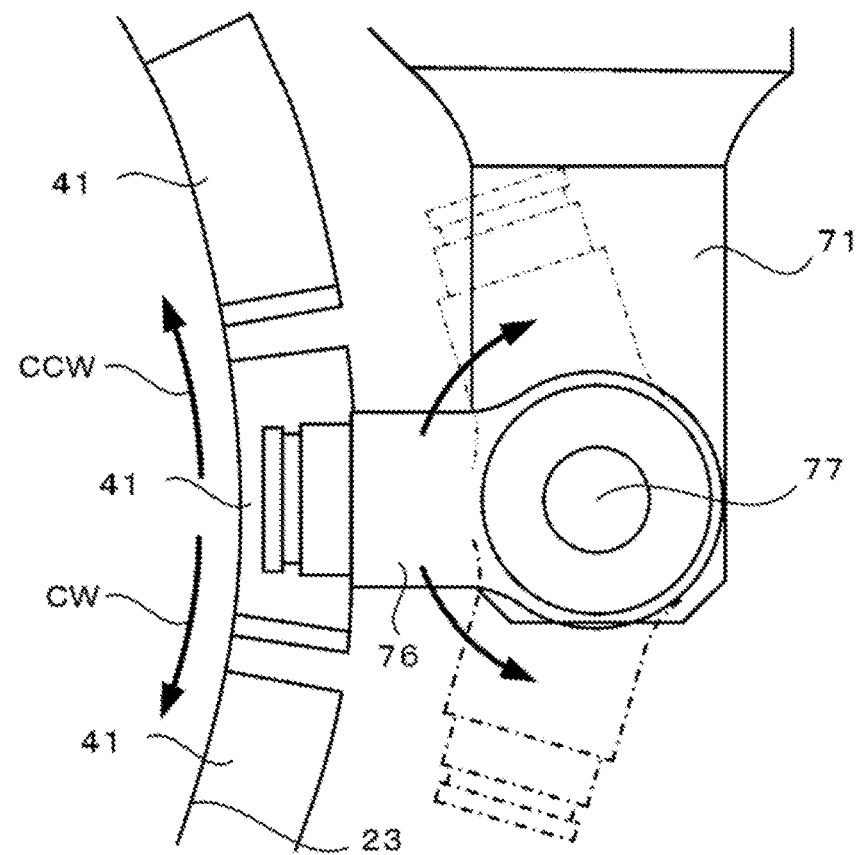
FIG. 6 is a plan view of engagement piece gripping section 76 which grips engagement piece 41.
Figure 7:
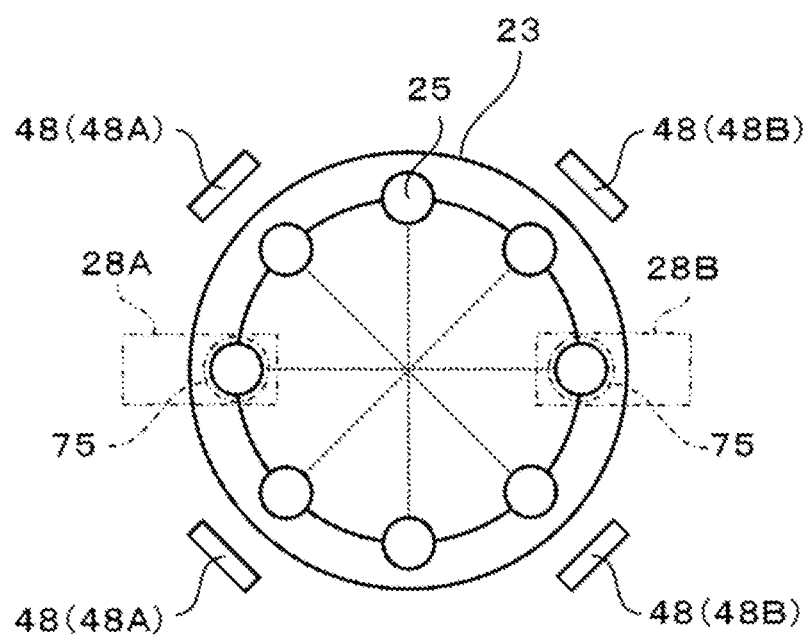
FIG. 7 is a plan view of rotating body 23.

An embodiment of the present disclosure will be described as below by referring to drawings. FIG. 1 is a brief explanatory view illustrating an example of mounting system 10. FIG. 2 is an explanatory view of mounting head 22. FIG. 3 is a perspective view of a lever gripping section 47 which grips valve operation lever 45. FIG. 4 is a plan view of lever gripping section 47 which grips valve operation lever 45. FIG. 5 is a perspective view of engagement piece gripping section 76 which grips engagement piece 41. FIG. 6 is a plan view of engagement piece gripping section 76 which grips engagement piece 41. FIG. 7 is a plan view of rotating body 23. Mounting system 10 is, for example, a system for executing a process of mounting component P on board S. This mounting system 10 includes mounting device 11 and management computer (PC) 80. Mounting system 10 is configured as a mounting line in which multiple mounting devices 11 are arranged from an upstream to a downstream. In FIG. 1, only single mounting device 11 is shown as a matter of convenience in description. Management PC 80 is configured as a server for managing information of each device of mounting system 10. Management PC 80 prepares mounting condition information including mounting jobs for use for a mounting process of component P and transmits the information to mounting device 11. In the present embodiment, a left-right direction (an X-axis), a front-rear direction (a Y-axis), and an up-down direction (a Z-axis) are those shown in FIGS. 1 and 2.

As shown in FIG. 1, mounting device 11 includes board processing section 12, component supply section 14, component imaging section 19, mounting section 20, and control section 30. Board processing section 12 is a unit for loading, conveying, fixing in a mounting position, and unloading board S. Board processing section 12 has a pair of conveyor belts which are provided apart from each other at the front and rear of FIG. 1 and stretched in the left-right direction. Board S is conveyed by the conveyor belts.

Component supply section 14 has multiple feeders 15, each including a reel, and a tray unit and is detachably attached to a front end of mounting device 11. A tape, functioning as a component holding member, is wound around each reel, and multiple components P are held on a surface of the tape along a longitudinal direction of the tape. This tape is unwound from the reel towards the rear and is fed out to a picking up position where component P is picked up with nozzle 25 by a feeder section with components left exposed. In this component supply section 14, replenishment feeder 17, on which tape 18 holding components P identical to those of feeder 15 are mounted, can be set in a vacant slot. Mounting device 11 continues the mounting process using spare components P held on replenishment feeder 17 in the event that a component shortage occurs in feeder 15. The tray unit has trays, functioning as component holding members, on each of which multiple components are arranged, and the trays are moved in and out to a predetermined picking up position.

Mounting section 20 is a unit for picking up component P from component supply section 14 and placing it on board S fixed in board processing section 12. Mounting section 20 includes head moving section 21, mounting head 22, rotating body 23, holders 24, and nozzles 25. Head moving section 21 includes a slider movable in XY-directions while being guided by guide rails and a motor for driving the slider. Mounting head 22 is detachably mounted on the slider and is caused to move in the XY-directions by head moving section 21. One or more nozzles 25 are detachably mounted on a lower face of mounting head 22 via rotating body 23. Multiple nozzles 25 (for example, 16, 8, or 4) are mounted on rotating body 23 via holders 24, so as to pick up multiple components P at one time. Nozzle 25 is a pickup member for picking up a component by making use of a negative pressure and is detachably mounted on mounting head 22 via corresponding holder 24. The pickup member may be made up of a mechanical chuck which is configured to grip and pick up component P.

As shown in FIG. 2, mounting head 22 includes rotating body 23, valve driving devices 46, R-axis driving section 26, Q-axis driving section 27, first Z-axis driving sections 28, and second Z-axis driving sections 29.

Rotating body 23 is a circular cylindrical member and includes holders 24, nozzles 25, and valve operation levers 45. Multiple holders 24 are provided at predetermined intervals (here, eight holders 24 disposed at intervals of a center angle of 45°) in a circumferential direction of rotating body 23. Nozzle 25 is attached to a distal end portion of each holder 24 in an exchangeable fashion. Nozzle 25 picks up a component by a negative pressure being supplied thereto via a pressure adjustment valve, not shown, and releases the component so picked up by a positive pressure being supplied thereto via the same pressure adjustment valve. Valve operation levers 45 are a lever for operating the pressure adjustment valve and are provided individually for nozzles 25 along a circumference of rotating body 23. Valve operation lever 45 is an alternate-type lever and can be switched among a negative pressure supply position where a negative pressure is supplied to nozzle 25, an atmospheric pressure supply position where an atmospheric pressure is supplied to nozzle 25, and a positive pressure supply position where a positive pressure is supplied to nozzle 25.

Valve driving devices 46 are provided at two locations on a turning (revolving) track of valve operation levers 45 and are configured to lift and lower individually the valve operation levers 45 at those two locations. In the present embodiment, valve driving devices 46 are provided in such a manner as to face oppositely each other in the left-right directions across a center of rotating body 23. Valve driving device 46 includes lever gripping section 47 configured to grip a horizontal plane of valve operation lever 45 from above and below and positions valve operation lever 45 in any one of the positions described above by raising or lowering lever griping section 47. As shown in FIG. 3, lever gripping section 47 is attached in such a manner as to rotate abound perpendicular shaft 49 via a spring and is normally held in a posture lying substantially perpendicular to a cylindrical side face of rotating body 23. Here, as shown in shown in FIG. 4, rotating body 23 can rotate not only clockwise CW (a forward direction) but also counterclockwise CCW (a backward direction). Further, by a spring, lever gripping section 47 is normally held in a position as indicated by the solid lines in FIG. 4. When a member (for example, valve operation lever 45) attached to rotating body 23 comes into interference (contact) with lever gripping section 47 for some reason while rotating body 23 is rotating clockwise CW, lever gripping section 47 is pushed to rotate by the member, reaching a first retraction position (refer to alternate long and short dash lines in FIG. 4). Additionally, when a member (for example, valve operation lever 45) attached to rotating body 23 comes into interference (contact) with lever gripping section 47 for some reason while rotating body 23 is rotating counterclockwise CCW, lever gripping section 47 is pushed to rotate by the member, reaching a second retraction position (refer to chain double-dashed lines in FIG. 4). That is, when coming into interference with the member equipped on rotating body 23 which is rotating, lever gripping section 47 retracts in the direction in which lever gripping section 47 is pushed by the member. Lever gripping section 47 is automatically restored to the normal position (indicated by the solid lines in FIG. 4) by the spring after it has reached to either of the retraction positions. In the following description, valve driving device 46 provided on a left-hand side of mounting head 22 may be referred to as first valve driving device 46A, while valve driving device 46 provided on a right-hand side of mounting head 22 may be referred to as second valve driving device 46B from time to time.

As shown in FIG. 2, R-axis driving section 26 includes R shaft 51, R-axis motor 54, and an R-axis position sensor, not shown. R shaft 51 extends in the up-down direction, and a lower end thereof is attached to a center shaft of rotating body 23. R-axis motor 54 drives to rotate gear 53 meshing with R-axis gear 52 provided at an upper end of R shaft 51. The R-axis position sensor detects a rotational position of R-axis motor 54. R-axis driving section 26 drives to rotate R shaft 51 by R-axis motor 54 via gear 53 and R-axis gear 52 to thereby turn (revolve) multiple holders 24 supported on rotating body 23 together with multiple nozzles 25 in the circumferential direction. That is, nozzles 25 intermittently revolve at a predetermined interval. Rotating body 23 can turn both clockwise CW (the forward direction) and counterclockwise CCW (the backward direction) as viewed from above. In the present embodiment, since the numbers of holders 24 and nozzles 25 are eight, rotating body 23 intermittently rotates at an interval of a center angle of 45°.

Q-axis driving section 27 includes Q-axis gears 61, 62, which are disposed in two stages of an upper stage and a lower stage, gears 63, 64, Q-axis motor 65, and a Q-axis position sensor (not shown). Upper- and lower-stage Q-axis gears 61, 62 are passed on R shaft 51 concentrically and in such a manner as to rotate relatively to R-axis 51. Gear 63 is provided at an upper portion of each holder 24 and meshes with lower-stage Q-axis gear 61 in such a manner as to slide in the up-down direction. Q-axis motor 65 drives to rotate gear 64 meshing with upper-stage Q-axis gear 62. The Q-axis position sensor detects a rotational position of Q-axis motor 65. Q-axis driving section 27 rotates gears 63 meshing with Q-axis gear 61 by driving to rotate Q-axis gears 61, 62 by Q-axis motor 65 to thereby individually rotate holders 24 on their own center axes the same rotational amount in the same rotational direction. As holders 24 so rotate, corresponding nozzles 25 also rotate (on their own center axes).

Z-axis driving sections 28 are provided at two locations on a turning (revolving) track of holders 24 and are configured to lift and lower holders 24 at the two locations. In the present embodiment, Z-axis driving sections 28 are provided in such a manner as to face oppositely each other in the left-right direction across the center of rotating body 23. Z-axis driving section 28 includes Z-axis slider 71, Z-axis motor 73, and a Z-axis position sensor, not shown. Z-axis slider 71 is attached to ball screw 72 extending in the up-down direction in such a manner as to be lifted and lowered. Z-axis slider 71 includes engagement piece gripping section 76 configured to grip a horizontal plane of engagement piece 41 extending horizontally (in a perpendicular direction relative to the cylindrical side face of rotating body 23) from holder 24 (refer to FIG. 6). Z-axis motor 73 rotates ball screw 72 to thereby lift and lower Z-axis slider 71. The Z-axis position sensor detects a lifted position and a lowered position of Z-axis slider 71. Z-axis driving section 28 lifts and lowers holder 24 and nozzle 25 which are integrated with Z-axis slider 71 by driving Z-axis motor 73 to thereby lift and lower Z-axis slider 71 along ball screw 72. When holder 24 is turned together with rotating body 23 to thereby be positioned at the location (lifting and lowering position 75, refer to FIG. 7) where Z-axis driving section 28 is disposed, engagement piece 41 of holder 24 in question is gripped by engagement piece gripping section 76 of Z-axis slider 71. In addition, when holder 24 moves away from lifting and lowering position 75, engagement piece 41 of holder 24 in question is dislocated from engagement piece gripping section 76 of Z-axis slider 71. Holder 24 is passed through spring 42 which contacts gear 63 at an upper end and contacts an upper face of rotating body 23 at a lower end thereof. As a result, engagement piece 41 is positioned in a regular position in the up-down direction by spring 42 in such a state that engagement piece 41 is not gripped by engagement piece gripping section 76. In the following description, Z-axis driving section 28 provided on the left-hand side of mounting head 22 is referred to as first Z-axis driving section 28A, while Z-axis driving section 28 provided on the right-hand side of mounting head 22 is referred to as second Z-axis driving section 28B.

Here, as shown in FIG. 6, rotating body 23 can rotate not only clockwise CW (the forward direction) but also counterclockwise CCW (the backward direction). In addition, engagement piece gripping section 76 is attached in such a manner as to rotate around vertical shaft 77; however, engagement piece gripping section 76 is normally held in a posture (a posture substantially perpendicular to the cylindrical side face of rotating body 23) indicted by solid lines in FIG. 7 by a spring or the like. When a member (for example, engagement piece 41) attached to rotating body 23 comes into interference (contact) with engagement piece gripping section 76 for some reason while rotating body 23 is rotating clockwise CW, engagement piece gripping section 76 is pushed to rotate by the member and is then held in a first retraction position (refer to alternate long and short dash lines in FIG. 6). Further, when the member (for example, engagement piece 41) attached to rotating body 23 comes into interference (contact) with engagement piece gripping section 76 for some reason while rotating body 23 is rotating counterclockwise CCW, engagement piece gripping section 76 is pushed to rotate by the member and is then held in a second retraction position (refer to chain double-dashed lines in FIG. 6). That is, engagement piece gripping section 76 retracts in the direction in which engagement piece gripping section 76 is pushed by the member equipped on rotating body 23 when engagement piece gripping section 76 comes into interference with the member. While held in the first and second retraction positions, engagement piece gripping section 76 never comes into interference with other members even when rotating body 23 rotates forwards or backwards. Engagement piece gripping section 76 staying in either of the two retraction positions can easily be restored to the normal position (indicated by the solid lines in FIG. 6) by manually being operated by the operator or the like.

Figure 8:
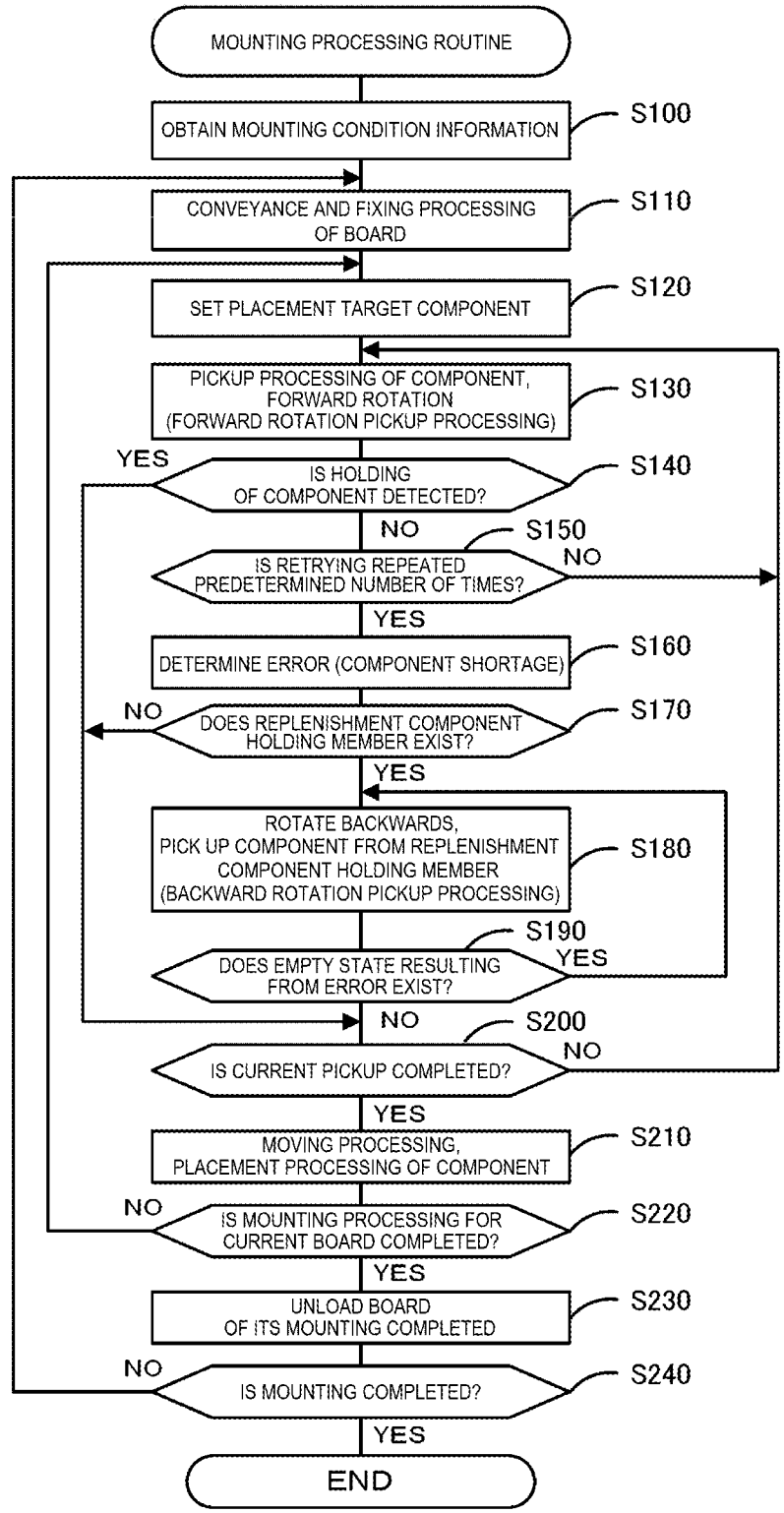
FIG. 8 is a flowchart showing an example of a mounting processing routine.

As shown in FIG. 8, eight nozzles 25 are disposed at equal intervals on rotating body 23. Nozzles 25 facing oppositely each other across the center axis of rotating body 23 are also referred to as the nozzles of the same set, and when those nozzles are disposed in lifting and lowering positions 75, the nozzles can be lifted or lowered at the same time by first Z-axis driving section 28A and second Z-axis driving section 28B.

As shown in FIGS. 2 and 7, side camera 48 images the vicinity of a distal end portion of nozzle 25 from a side thereof after nozzle 25 in question has executed a suction operation in order to determine whether nozzle 25 in question has picked up a component properly or a suction posture thereof. Such side cameras 48 are provided at two locations lying near first Z-axis driving section 28A and at two locations lying near second Z-axis driving section 28B. Hereinafter, two side cameras 48 situated near first Z-axis driving section 28A are referred to as first side cameras 48A, while two side cameras 48 situated near second Z-axis driving section 28B are referred to as second side cameras 48B. When nozzle 25 is lowered by first Z-axis driving section 28A to execute a suction operation, and thereafter, nozzle 25 in question is turned clockwise to one position forwards, nozzle 25 in question can be imaged with a first one of two first side cameras 48A, while when nozzle 25 in question is turned counterclockwise to one position backwards, nozzle 25 in question can be imaged with a second one of two first side cameras 48. In addition, when nozzle 25 is lowered by second Z-axis driving section 28B to execute a suction operation, and thereafter, nozzle 25 in question is turned clockwise to one position forwards, nozzle 25 in question can be imaged with a first one of two second side cameras 48B, while when nozzle 25 in question is turned counterclockwise to one position backwards, nozzle 25 in question can be imaged with a second one of two second side cameras 48B.

As shown in FIG. 1, control section 30 is configured as a microprocessor made up mainly of CPU 31 functioning as a control unit and includes a memory section 32 configured to store various types of data, and the like. Control section 30 described above outputs control signals to board processing section 12, component supply section 14, and mounting section 20 and receives, as inputs, signals from mounting section 20 and component supply section 14. Mounting condition information 33 is stored in memory section 32, the mounting condition information 33 including pieces of information such as a pickup order and a pickup release order, component type identifications (ID), nozzles 25 to be used, placement coordinates, and the like. Mounting condition information 33 described above is obtained from management PC 80 to be stored in memory section 32.

Next, operations of mounting system 10 of the present embodiment configured as described heretofore will be described, and more particularly, a mounting process executed by mounting device 11 will be described below. FIG. 8 is a flowchart showing an example of a mounting processing routine which is executed by CPU 31 of mounting device 11. This routine is stored in memory section 32 and is then executed based on an input by the operator which notifies a start of mounting. When this routine is stared, CPU 31 firstly reads out and obtains mounting condition information 33 (S100) and causes board processing section 12 to execute a conveyance and fixing process of board S (S110). Next, CPU31 sets component P to be picked up based on the pickup order in mounting condition information 33 (S120). Here, CPU31 sets one or more components P which are picked up during one reciprocating movement (also referred to as the same step) of mounting head 22 in which mounting head 22 picks up one or more components P from component supply section 14 to place them on board S and returns to component supply section 14. Next, CPU31 executes a forward rotation pickup processing in which nozzles 25 are mounted or exchanged as required, components P are picked up, and rotating body 23 is rotated forwards (S130).

Next, CPU31 detects whether component P picked up with nozzle 25 is kept held to nozzle 25 in question (S140). CPU 31 executes this detecting process based on a captured image captured by side camera 48. If it detects that component P remains held to nozzle 25, CPU 31 determines whether picking up of component P in the same step carried out currently is completed (S200). If it determines that the picking up of component P in the same step has not yet been completed, CPU 31 executes the processes in S130 onwards. That is, CPU 31 executes the forward rotation pickup processing until the picking up of component P in the same step is completed and executes repeatedly the processing of detecting the holding of component P. On the other hand, if it detects in S140 that component P is not held to nozzle 25, CPU 31 determines whether the forward rotation pickup processing has been retried continuously a predetermined number of times in such a state that component P is not held to nozzle 25 (S150). This predetermined number of times is empirically determined to, for example, a value (for example, three times) at which a component shortage on tape 16 mounted in feeder 15 is determined. The component shortage on tape 16 can be determined by managing the number of times of use but is desirably determined based on an actually measured number of times. If it determines that the forward rotation pickup processing has not yet been retried continuously the predetermined number of times, CPU 31 executes the processing in S130 onwards. CPU 31 may be configured to detect a pickup error in the event that the holding of component P is not detected only once.

On the other hand, if the forward rotation pickup processing has been retried the predetermined number of times without detecting the holding of component P continuously the predetermined number of times, CPU 31 determines a component shortage error (S160) and determines whether there exists a replenishment component holding member (S170). For example, in the case of a component shortage in feeder 15, CPU 31 determines whether there exists tape 18 in replenishment feeder 17. Additionally, in the case of a component shortage in the tray unit, CPU 31 determines whether there exists a replenishment tray. If there exists no replenishment component holding member, CPU 31 executes the processing in S200 onwards, while if there exists a replenishment component holding member, CPU 31 executes a backward rotation pickup processing in which rotating body 23 is rotated backwards and component P is picked up from the replenishment component holding member (S180). Here, since the holding of component onto nozzle 25 has already been detected continuously the predetermined number of times, when rotating body 23 is rotated backwards, vacant nozzle 25 is disposed in lifting and lowering position 75. Then, CPU31 determines whether there exists vacant nozzle 25 based on a component shortage error (S190), and if it determines that there exists vacant nozzle 25 based on the component shortage error, CPU 31 executes the processing in S180 onwards. On the other hand, if it determines in S190 that there exists no vacant nozzle 25 based on the component shortage error, CPU 31 determines in S200 whether picking up of component P in the same step currently carried out has been completed. If it determines that the picking up of component P in the same step has not yet been completed, CPU 31 executes the processing in S130 onwards.

Figure 9:
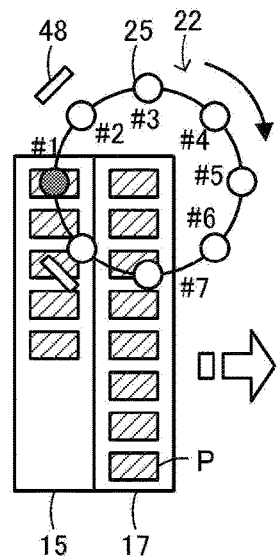
FIG. 9 is an explanatory diagram showing an example of a forward rotation pickup processing and a backward rotation pickup processing.
Figure 9:
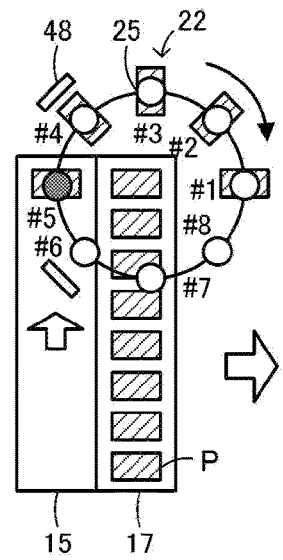
Figure 9:
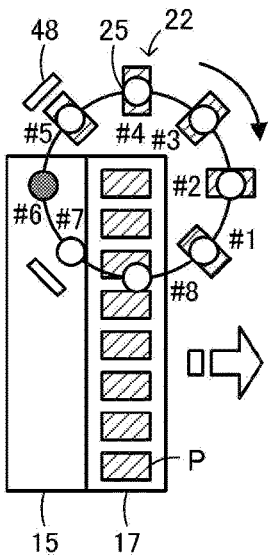
Figure 9:
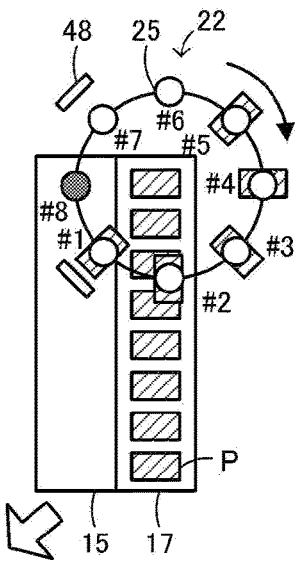
Figure 9:
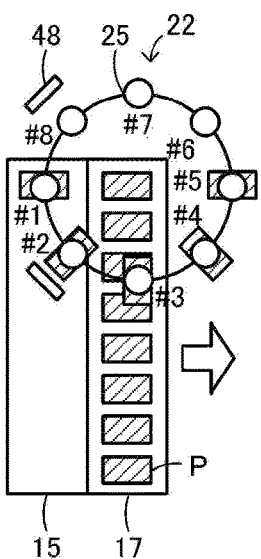
Figure 9:
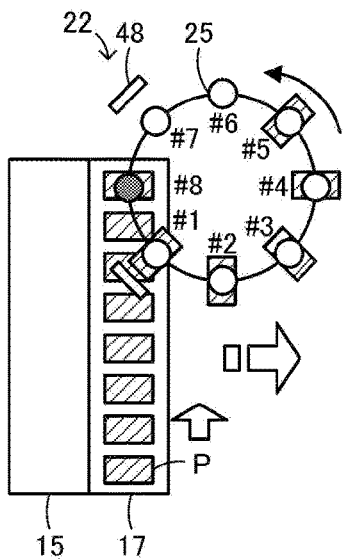
Figure 9:
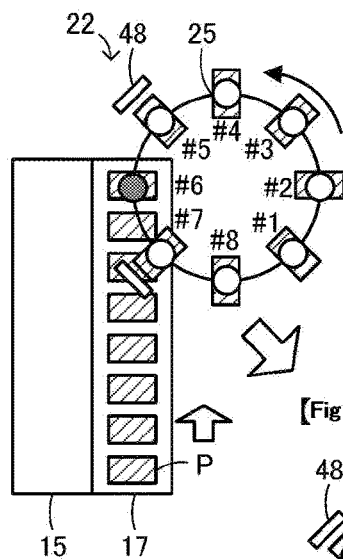
Figure 9:
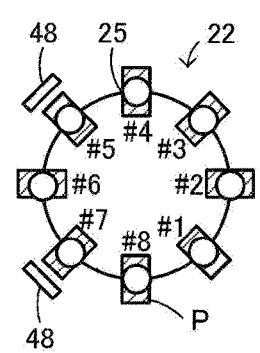

FIG. 9 is an explanatory diagram showing an example of a forward rotation pickup processing and a backward rotation pickup processing at rotating body 23, in which FIGS. 9a, 9b are explanatory diagrams illustrating a forward rotation pickup processing of component P, FIGS. 9c to 9e are explanatory diagrams illustrating a forward rotation pickup processing for a component shortage, FIGS. 9f, 9g are explanatory diagrams illustrating a backward rotation pickup processing, and FIG. 9h is an explanatory diagram illustrating mounting head 22 which has picked up all components P that is should. In FIG. 9, shaded nozzles 25 indicate that a pressure applied thereto is switched to a negative pressure. Additionally, in FIG. 9, numbers 1 to 8 are affixed, respectively, to first to eighth nozzles 25 arranged in the order of picking up components P. CPU31 executes repeatedly a forward rotation pickup processing in which rotating body 23 is rotated forwards while components P are picked up subsequently (FIGS. 9a, 9b). In the event that there occurs a component shortage in feeder 15 while a mounting process continues, vacant nozzle 25 is generated (FIGS. 9c, 9d), and in the event that the generation of vacant nozzle 25 continues a predetermined number of times (here, "3"), CPU 31 determines a component shortage in feeder 15 (FIG. 9e). Subsequently, CPU31 determines whether replenishment feeder 17 is mounted, and when replenishment feeder 17 is mounted, CPU 31 executes a backward rotation pickup processing in which rotating body 23 is rotated backwards, causing vacant nozzles 25 to pick up components P (FIGS. 9*f,* 9*g*). Here, since three nozzles 25 are vacant, CPU 31 repeats the processing three times in which rotating body 23 is rotated backwards and component P is picked up with vacant nozzle 25. In this way, there can be provided a state in which all components P, which are initially scheduled to be picked up, are picked up with nozzles 25 (FIG. 9*h*).

Now, if picking up of components P in the same step currently carried out is completed in S200, a mounting process, that is, a process in which component P is moved to an arrangement position and a process in which component P so moved is placed on board S are executed (S210). Although the order of components P picked up through the backward rotation pickup processing differs from the original order, in the event that types of components P picked up in the same step remain the same, the picking up order does not particularly affect the placement order. On the other hand, in the event that types of components P picked up in the same step differ, CPU 31 only needs to place components P in the order in which components P are picked up. Subsequently, CPU31 determines whether the mounting process for the current board has been completed (S220), and if the mounting process has not yet been completed, CPU executes the processes in S120 onwards. That is, CPU31 sets component P to be picked up next, exchanges nozzles 25 as required, causes nozzle 25 to pick up component P in question, causes component P so picked up to be placed onto board S. On the other hand, if it determines in S220 that the mounting process for the current board has been completed, CPU 31 causes board processing section 12 to unload board S for which the mounting has been completed (S230), and determines whether the mounting jobs in mounting condition information 33 have been completed (S240). If it determines that the mounting jobs in mounting condition information 33 have not yet been completed, CPU 31 executes the processes in S110 onwards. On the other hand, if it determines that the mounting jobs in mounting condition information 33 have been completed, CPU 31 then ends the routine directly.

Here, the correspondence between the constituent elements of the present embodiment and constituent elements of the present disclosure will be made clear. Mounting head 22 of the present embodiment corresponds to a mounting head of the present disclosure, head moving section 21 to a moving section, and control section 30 to a control section. Additionally, side camera 48 and control section 30 correspond to a detecting section, tapes 16, 18 to a component holding member, Z-axis driving section 28 to a lifting and lowering section, engagement piece gripping section 76 to a pickup member engaging section, valve operation lever 45 to an operation lever, and lever gripping section 47 to a lever engaging section. In the present embodiment, an example of a control method for the mounting device of the present disclosure is also made clear by explaining the processing operations of control section 30.

In mounting device 11 of the present embodiment, which has been described heretofore, CPU 31 executes the forward rotation pickup processing in which nozzle 25 (the pickup member) is caused to pick up component P from component supply section 14 supplying component P and rotating body 23 is caused to rotate forwards and the backward rotation pickup processing including the processing in which rotating body 23 is caused to rotate backwards when there exists vacant nozzle 25 based on the error in which nozzle 25 holds no component P and the processing in which vacant nozzle 25 is caused to pick up component P from component supply section 14. For example, in conventional mounting devices, when vacant nozzle 25 based on an error is generated, depending on a case, component P causing the error is put aside, so that a mounting process of component P in question is performed at a later step. In this case, since a picking up and moving process of component P, which is not originally scheduled, is caused based on the error, the efficiency of the mounting process is deteriorated. In addition, in some of conventional mounting devices, rotating body 23 is not allowed to rotate backwards from a structural reason. With mounting device 11 of the present embodiment, since vacant nozzle 25 based on the error is caused to pick up component P again, the generation of vacant nozzles 25 failing to pick up a component can be reduced, and the separate step described above does not have to be carried out. Further, with this mounting device 11, since rotating body 23 is caused to rotate backwards in causing vacant nozzle 25 to pick up component P, vacant nozzle 25 can be caused to pick up component P more quickly than a case in which rotating body 23 is caused to rotate further forwards to pick up component P. As a result, with this mounting device 11, the efficiency in picking up and moving component P can be enhanced more.

In addition, in the event that there exist multiple vacant nozzles 25, control section 30 executes the backward rotation processing in which the processing is executed repeatedly in which rotating body 23 is caused to rotate backwards at intervals at which nozzles 25 are provided, causing vacant nozzles 25 to individually pick up component P. With this mounting device 11, in causing vacant nozzles 25 to pick up components P subsequently, since vacant nozzle 25 situated nearest to the current pickup position is caused to pick up component P, the loss in rotational movement of rotating body 23 is reduced, thereby making it possible to enhance the efficiency more. Further, component supply section 14 has tape 16 (the component holding member) holding components P thereon and replenishment tape 18 holding components P thereon, and in the event that vacant nozzle 25 is generated continuously the predetermined number of times when causing mounting head 22 to pick up component P from tape 16, control section 30 detects the component shortage on tape 16 as an error, whereupon, in the event that replenishment tape 18 is provided, control section 30 executes the backward rotation pickup processing in which vacant nozzle 25 is caused to pick up component P from that replenishment tape 18. With this mounting device 11, the component shortage on tape 16 that component supply section 14 has can be detected from the state of vacant nozzle 25. Additionally, with mounting device 11 described above, since vacant nozzle 25, which is caused when the error of component shortage occurs, can be caused to pick up component P, a reduction in efficiency, which would be generated when the error of component shortage occurs, can be reduced more, thereby making it possible to enhance the efficiency more in picking up and moving component P. Further, mounting device 11 described above includes side cameras 48 and control section 30 (the detecting section) which are configured to detect the fact that component P is not held to nozzle 25 which is caused to attempt to pick up component P as an error, and control section 30 determines whether there exists vacant nozzle 25 based on the error. With this mounting device 11, vacant nozzle 25 can be caused to pick up component P using the detection results of the detection employing side camera 48.

In addition, in mounting device 11, mounting head 22 has Z-axis driving section 28 (the lifting and lowering section) which is provided independently of rotating body 23 and which is configured to lift and lower nozzle 25 of multiple nozzles 25 which is situated in lifting and lowering position 75 (the predetermined position) of mounting head 22, Z-axis driving section 28 has engagement piece gripping section 76 (the pickup member engaging section) configured to mesh with nozzle 25 situated in the lifting and lowering position 75 to thereby lift and lower nozzle 25, and when engagement piece gripping section 76 comes into interference with the member (for example, engagement piece 41) equipped on rotating body 23 which is rotating forwards, engagement piece gripping section 76 rotates to retract in the direction in which engagement piece gripping section 76 is pushed by the member, while when engagement piece gripping section 76 comes into interference with the member equipped on rotating body 23 which is rotating backwards, engagement piece gripping section 76 rotates to retract in the direction in which engagement piece gripping section 76 is pushed by the member. With this mounting device 11, there is caused no problem even when engagement piece gripping section 76 comes into interference with the member equipped on rotating body 23 which is rotating forwards or is rotating backwards, whereby the forward and backward rotations of rotating body 23 can be executed in a more ensured fashion.

In mounting device 11, the pickup member is nozzle 25 which detachably sucks component P using pressures, rotating body 23 includes valve operation levers 45 (the operation levers) which are provided individually for nozzles 25 to switch the pressure supplied to nozzles 25 between the positive and negative pressures, and mounting head 22 includes, independently of rotating body 23, lever gripping sections 47 (the lever engaging sections) which are configured to come into engagement with corresponding valve operation levers 45 to operate valve operation levers 45. When this lever gripping section 47 comes into interference with the member (for example, valve operation lever 45) equipped on rotating body 23, which is rotating forwards, lever gripping section 47 in question rotates to retract in the direction in which lever gripping section 47 in question is pushed by the member, whereas when lever gripping section 47 comes into interference with the member equipped on rotating body 23, which is rotating backwards, lever gripping section 47 in question rotates to retract in the direction in which lever gripping section 47 in question is pushed by the member. With this mounting device 11, there is caused no problem even if lever gripping section 47 should come into interference with the member equipped on rotating body 23, which is rotating forwards or is rotating backwards, whereby the forward and backward rotations of rotating body 23 can be executed in a more ensured fashion.

The mounting device and the control method for the mounting device are not limited to the embodiment that has been described above in any way, and needless to say, the present disclosure can be carried out in various forms without departing from the technical scope of the present disclosure.

For example, in the embodiment described above, mounting head 22 is described as having lifting and lowering positions 75 disposed at the two locations; however, the present disclosure is not particularly limited thereto, and hence, mounting head 22 may have single lifting and lowering position 75 disposed at one location or may have three or more lifting and lowering positions 75. Mounting head 22 only needs to be configured so as to rotate rotating body 23 forwards and backwards.

In the embodiment described above, control section 30 is described as detecting whether picked up component P is held to nozzle 25 by use of the image captured by side camera 48; however, the present disclosure is not particularly limited thereto, and hence, for example, a sensor may be used, the sensor being configured to detect component P held to nozzle 25 in a contact or non-contact fashion. As a means for detecting a state of nozzle 25, a means for detecting a pressure at nozzle 25 may be employed. Additionally, in the case of the pickup member being a mechanical chuck (a gripping member) for gripping component P, a gripping force of the mechanical chuck may be detected as a state of nozzle 25. Even though these configurations are adopted, a held state of component P can be detected.

Figure 10:
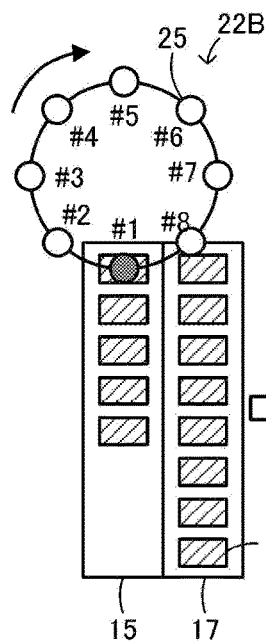
FIG. 10 is an explanatory diagram showing an example of a different forward rotation pickup processing and a different backward rotation pickup processing.
Figure 10:
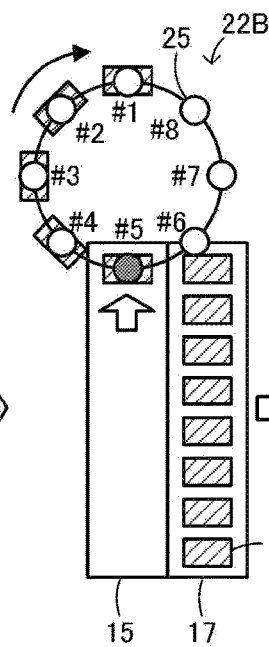
Figure 10:
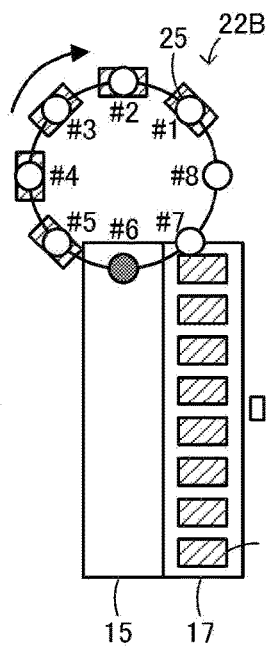
Figure 10:
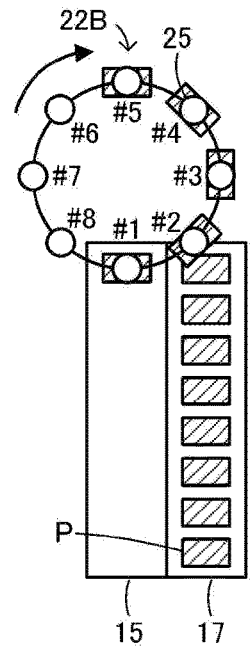
Figure 10:
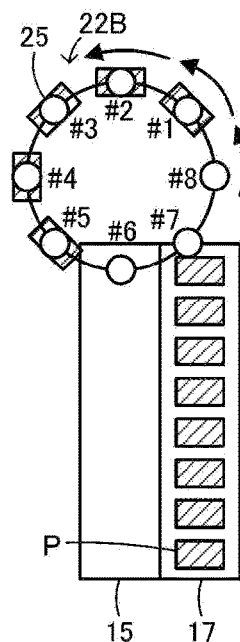
Figure 10:
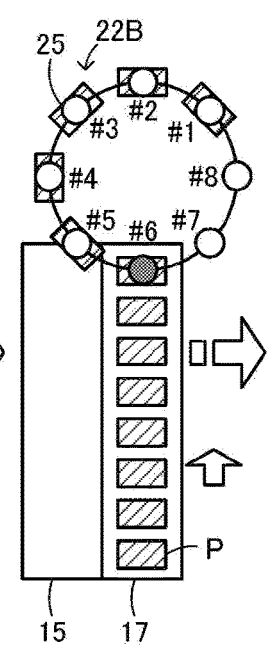
Figure 10:
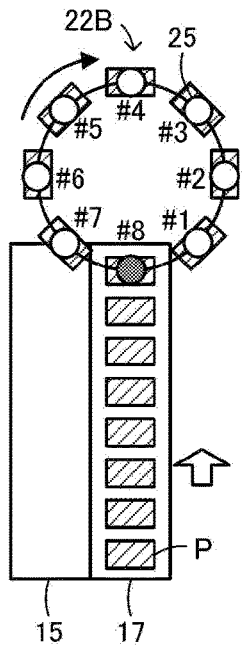
Figure 10:
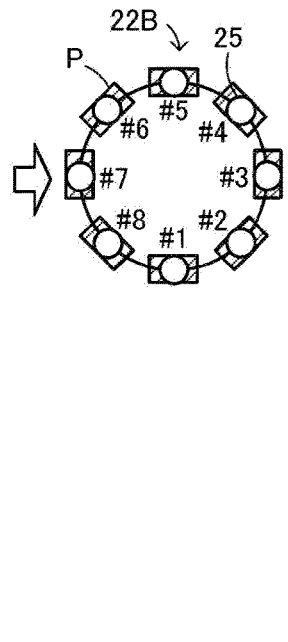

In the embodiment described above, the backward rotation processing is described as being executed in which the processing is executed repeatedly in which vacant nozzle 25 is caused to pick up component P by causing rotating body 23 to rotate backwards at the intervals at which nozzles 25 are disposed; however, the present disclosure is not particularly limited thereto. For example, in the event that there exist multiple vacant nozzles 25, CPU 31 may be configured to execute a backward rotation processing in which a forward rotation and pickup processing is executed repeatedly in which rotating body 23 is caused to rotate forwards after rotating body 23 is caused to rotate backwards to leading-end vacant nozzle 25 to thereby cause vacant nozzle 25 to pick up component P. FIG. 10 is an explanatory diagram illustrating an example of a different forward rotation pickup processing and a different backward rotation pickup processing. In FIG. 10, a description will be made by reference to mounting head 22B in which single lifting and lowering position 75 is provided at one location as an example. In FIG. 10, FIGS. 10a, 10b are explanatory diagrams illustrating a forward rotation pickup processing of component P, FIGS. 10c, 10d are explanatory diagrams illustrating a forward rotation pickup processing for a component shortage, FIG. 10e is an explanatory diagram illustrating a backward rotation processing, FIGS. 10f, 10g are explanatory diagrams illustrating a processing in which a forward rotation is executed after a backward rotation to pick up component P, and FIG. 10h is an explanatory diagram illustrating mounting head 22B which picks up all components P scheduled to be picked up. In mounting head 22B, a position of No. 1 nozzle 25 in FIG. 10a denotes a lifting and lowering position. In addition, in FIG. 10, although the illustration of side cameras 48 is omitted, a detection of whether picked up component P is held to nozzle 25 may be executed by employing side cameras, pressures at nozzles 25, or sensors. CPU 31 executes repeatedly a forward rotation pickup processing in which component P is picked up and rotating body 23 is caused to rotate forwards (FIGS. 10a, 10b). When the mounting process continues, resulting in a component shortage in feeder 15, vacant nozzle 25 is generated (FIGS. 10c, 10d), and in the event that the generation of vacant nozzle 25 continues a predetermined number of times (for example, three times), CPU 31 determines a component shortage in feeder 15 (FIG. 10e). Subsequently, in the event that replenishment feeder 17 is mounted, CPU 31 causes rotating body 23 to rotate backwards to leading-end vacant nozzle 25 (FIG. 10e). Here, CPU31 causes rotating body 23 to rotate backwards continuously an amount corresponding to three vacant nozzles 25. Then, CPU31 executes a pickup processing in which vacant nozzles 25 are caused to individually pick up component P (FIGS. 10f, 10g). In this manner, a state can be provided in which all components P, which are originally scheduled to be picked up, are picked up with corresponding nozzles 25 (FIG. 10h). With this mounting device 11, since the picking up order of components P becomes the originally scheduled order even when the backward rotation processing is carried out, the generation of a drawback which would be generated by a change in picking up order can be prevented.

With the embodiment described above, the component shortage error is described as being detected in the event that nozzle 25 holding component P is not detected continuously the predetermined number of times; however, the present disclosure is not particularly limited thereto, and hence, the generation of vacant nozzle 25 may be reduced by adopting a configuration in which a component shortage error is detected before nozzle 25 holding component P is not detected continuously the predetermined number of times. Additionally, mounting device 11 may be configured to execute the backward rotation pickup processing not only for the component shortage but also for a pickup error of nozzle 25. With this mounting device 11, the efficiency in picking up and moving component P can be enhanced more. At this time, for example, when component P is picked up during a retry made after holding of picked up component P is not detected, control section 30 may detect the previous pickup of component P as a pickup error.

In the embodiment described above, the present disclosure is described as being applied to mounting device 11; however, the present disclosure may be applied to a control method for mounting device 11 or to a program executing the control method.

Here, the mounting device and the control method for the mounting device of the present disclosure may be configured as will be described below. In the mounting device of the present disclosure, when there exist the multiple pickup members, the control section may execute the backward rotation processing in which a processing is repeatedly executed in which the rotating body is caused to rotate backwards at the predetermined intervals to thereby cause the vacant pickup member to pick up the component. With this mounting device, in causing the vacant nozzles to pick up components subsequently, since the vacant nozzle situated nearest to the current pickup position is caused to pick up a component, the loss in rotational movement of the rotating body is reduced, thereby making it possible to enhance the efficiency more. Alternatively, in the mounting device of the present disclosure, when there exist the multiple vacant pickup members, the control section may execute the backward rotation processing in which the forward rotation in which the rotating body is caused to rotate forwards after the rotating body is caused to rotate backwards to the leading-end vacant pickup member to thereby cause the vacant pickup member to pick up the component and the pickup processing are executed repeatedly. In this mounting device, after the rotating body is caused to rotate backwards to the leading-end vacant pickup member when the rotating body is caused to rotate forwards, the vacant pickup member is caused to pick up the component while causing the rotating body to rotate forwards. With this mounting device, since the order in which the components are picked up becomes the originally scheduled order even when the backward rotating processing is executed, the generation of a drawback that would be generated by a change in pickup order can be prevented.

In the mounting device of the present disclosure, the supply section may have a component holding member for holding the component and a replenishment component holding member for holding the component, and the control section may detect a component shortage in the component holding member as the error when the vacant pickup member is generated continuously a predetermined number of times in causing the mounting head to pick up the component from the component holding member, while when the replenishment component holding member is provided, the control section may execute the backward rotation pickup processing in which the mounting head is caused to pick up the component from the replenishment component holding member. With this mounting device, a component shortage in the component holding member that the supply section has can be detected based on a state of the vacant pickup member. In addition, with this mounting device, since the vacant pickup member which is generated when the component shortage error occurs can be caused to pick up the component, a reduction in efficiency which is generated when the component shortage error occurs can be reduced more, thereby making it possible to enhance the efficiency in picking up and moving the component.

The mounting device of the present disclosure may include a detecting section configured to detect the fact that the component picked up by the pickup member is not held to the pickup member as the error, and the control section may determine whether there exists the vacant pickup member based on the error from the detecting section. This mounting device can cause the vacant pickup member to pick up the component by use of the detection results of the detecting section. Here, the "detecting section" may include an imaging section configured to image a component picked up by the pickup member or may be configured to detect a state of the pickup member. As a form of detecting the state of the pickup member, in the case of the pickup member being a nozzle which picks up the component using a negative pressure, a form may be employed in which a pressure is detected, while in the case of the pickup member being a gripping section for gripping the component, a form may be employed in which a gripping force is detected.

In the mounting device of the present disclosure, the mounting head may have a lifting and lowering section which is provided independently of the rotating body and is configured to lift and lower the pickup member of the multiple pickup members which is positioned in a predetermined position on the mounting head, the lifting and lowering section may have a pickup member engaging section which is configured to come into engagement with the pickup member positioned in the predetermined position to thereby lift and lower the pickup member, and the pickup member engaging section may be configured to retract in a direction in which the pickup member engaging section is pushed by a member equipped on the rotating body, which is rotating, when the pickup member engaging section comes into interference with the member. Additionally, the pickup member engaging section may be configured to rotate to retract in a direction in which the pickup member engaging section is pushed by a member equipped on the rotating body, which is rotating forwards, when the pickup member engaging section comes into interference with the member, while when the pickup member engaging section comes into interference with a member equipped on the rotating body, which is rotating backwards, the pickup member engaging section may be configured to rotate to retract in a direction in which the pickup member engaging section is pushed by the member. With this mounting device, there is caused no problem even though the pickup member engaging section comes into interference with the rotating body, which is rotating forwards or backwards, thereby making it possible to execute the forward and backward rotations of the rotating body in a more ensured fashion.

In the mounting device of the present disclosure, the pickup member may be a nozzle for detachably sucking to pick up a component through pressure, the rotating body may include an operation lever for each of the pickup members to switch a pressure supplied to the nozzle between a positive and negative pressures, the mounting head may include, independently of the rotating body, a lever engaging section configured to be brought into engagement with the operation lever to thereby operate the operation lever, and the lever engaging section may retract in a direction in which the lever engaging section is pushed by a member equipped on the rotating body, which is rotating, when the lever engaging section comes into interference with the member. Additionally, the lever engaging section may rotate to retract in a direction in which the lever engaging section is pushed by a member equipped on the rotating body, which is rotating forwards, when the lever engaging section comes into interference with the member, while the lever engaging section may rotate to retract in a direction in which the lever engaging section is pushed by a member equipped on the rotating body, which is rotating backwards, when the lever engaging section comes into interference with the member. With this mounting device, there is caused no problem even if the lever engaging section should come into interference with the member equipped on the rotating body, which is rotating forwards or is rotating backwards, thereby making it possible for the forward and backward rotations of the rotating body to be executed in a more ensured fashion.

The control method for the mounting device of the present disclosure is a method for a mounting device comprising a mounting head, having a rotating body, which turns multiple pickup members by rotating the rotating body, in which the rotating body holds multiple pickup members, each of which being configured to pick up a component, the multiple pickup members being disposed at predetermined intervals along a predetermined circumference of the rotating body; a moving section configured to move the mounting head, wherein the method comprising steps of: executing a forward rotation pickup processing of causing the pickup members to pick up the components from a supply section for supplying the components, and rotates the rotating body forwards, and when at least one of the pickup members is vacant resulting from an error of not holding the component, executing a backward rotation pickup processing which includes a processing of causing the rotating body to rotate backwards and a processing of causing the vacant pickup member to pick up the component from the supply section.

With this control method for the mounting device, as with the mounting device described above, since the vacant pickup member resulting from the error is caused to pick up the component again, the generation of a vacant pickup member failing to pick up a component can be reduced. Additionally, with this control method, since the rotating body is caused to rotate backwards when the vacant pickup member is caused to pick up the component, the pickup member can pick up the component more quickly than a case in which the rotating body is caused to rotate forwards to pick up the component. Therefore, with this control method, the efficiency in picking up and moving the component can be enhanced more. In this control method for the mounting device, the various forms of the mounting device which are described above may be adopted, or steps for realizing the individual functions of the mounting device may be added.

INDUSTRIAL APPLICABILITY

The present disclosure can be applied to a technical field of devices for executing a mounting process in which a component is picked up for placement.

REFERENCE SIGNS LIST

10 Mounting system, 11 Mounting device, 12 Board processing unit, 14 Component supply section, 15 Feeder, 16 Tape, 17 Replenishment feeder, 18 Tape, 19 Component imaging section, 21 Head moving section, 22 Mounting head, 23 Rotating body, 24 Holder, 25 Nozzle, 26 R-axis driving section, 27 Q-axis driving section, 28 Z-axis driving section, 28A First Z-axis driving section, 28B Second Z-axis driving section, 30 Control section, 31 CPU, 32 Memory section, 33 Mounting condition information, 41 Engaging piece, 42 Spring, 45 Valve operation lever, 46, 46A, 46B Valve driving section, 47 Lever gripping section, 48, 48A, 48B Side camera, 49 Vertical shaft 51 R shaft, 52 R-axis gear, 53 Gear, 54 R-axis motor, 55 R-axis position sensor, 61, 62 Q-axis gear, 63, 64 Gear, 65 Q-axis motor, 66 Q-axis position sensor, 71 Z-axis slider, 72 Ball screw, 73 Z-axis motor, 74 Z-axis position sensor, 75 Lifting and lowering position, 76 Engaging piece gripping section, 77 Vertical shaft, 80 Management PC, P Component, S Board.

The invention claimed is:

1. A mounting device comprising:
   a mounting head that holds multiple pickup members, each of which being configured to pick up a component;
   a rotating body that turns the multiple pickup members when rotated, the multiple pickup members being disposed at predetermined intervals along a predetermined circumference of the rotating body;
   a moving section configured to move the mounting head;
   a control section configured to
      execute a forward rotation pickup processing that rotates the rotating body forwards and causes the pickup members to pick up the components from a supply section for supplying the components, and
      when at least one of the pickup members is a vacant pickup member resulting from an error of not holding the component, execute a backward rotation pickup processing that rotates the rotating body backwards and causes the vacant pickup member to pick up the component from the supply section; and
   a detecting section configured to detect a situation in which the pickup member, which is caused to pick up the component, does not hold the component as the error,
   wherein the control section determines whether the vacant pickup member exists based on the error from the detecting section.

2. The mounting device according to claim 1, wherein when there are multiple vacant pickup members, the control section executes the backward rotation pickup processing repeatedly in which the rotating body is caused to rotate backwards at the predetermined intervals thereby cause each of the vacant pickup members to pick up the component.

3. The mounting device according to claim 1, wherein when there are multiple vacant pickup members, the control section repeatedly executes a forward rotation pickup processing in which the rotating body is caused to rotate forwards after the rotating body is caused to rotate backwards to a leading-end vacant pickup member to thereby cause each of the vacant pickup members to pick up the component.

4. The mounting device according to claim 1,
   wherein the supply section comprises a component holding member configured to hold the component and a replenishment component holding member configured to hold the component, and wherein when the vacant pickup member is generated continuously a predetermined number of times when causing the mounting head to pick up the component from the component holding member, the control section detects a component shortage in the component holding member in question as the error and, when the replenishment component holding member is provided, the control section executes the backward rotation pickup processing in which the mounting head is caused to pick up the component from the replenishment component holding member.

5. The mounting device according to claim 1,
wherein the mounting head comprises a lifting and lowering section which is provided independently of the rotating body and is configured to lift and lower a pickup member of the multiple pickup members which is in a predetermined position on the mounting head,
wherein the lifting and lowering section comprises a pickup member engaging section configured to be brought into engagement with the pickup member in the predetermined position to thereby lift and lower the pickup member, and
wherein when coming into interference with a member equipped on the rotating body, which is rotating, the pickup member engaging section retracts in a direction in which the pickup member engaging section is pushed by the member.

6. The mounting device according to claim 1,
wherein the pickup members are each a nozzle configured to detachably suck to pick up a component through pressure,
wherein the rotating body comprises an operation lever provided for each of the pickup members to switch a pressure supplied to the nozzle between a positive pressure and a negative pressure,
wherein the mounting head comprises, independently of the rotating body, a lever engaging section configured to be brought into engagement with the operation lever to thereby operate the operation lever, and
wherein when coming into interference with a member equipped on the rotating body, which is rotating, the lever engaging section retracts in a direction in which the lever engaging section is pushed by the member.

7. A control method for a mounting device comprising a mounting head that holds multiple pickup members, each of which being configured to pick up a component; a rotating body that turns the multiple pickup members when rotated, the multiple pickup members being disposed at predetermined intervals along a predetermined circumference of the rotating body; and a moving section configured to move the mounting head, the method comprising steps of:
executing a forward rotation pickup processing that rotates the rotating body forwards and causes the pickup members to pick up the components from a supply section for supplying the components, and
when at least one of the pickup members is a vacant pickup member resulting from an error of not holding the component, executing a backward rotation pickup processing that rotates the rotating body backwards and a causes the vacant pickup member to pick up the component from the supply section,
wherein the mounting device further comprises a detecting section configured to detect a situation in which the pickup member, which is caused to pick up the component, does not hold the component as the error, and
wherein the vacant pickup member is determined to exist based on the error from the detecting section.

* * * * *